(12) United States Patent
Jung et al.

(10) Patent No.: US 11,145,757 B2
(45) Date of Patent: Oct. 12, 2021

(54) INTEGRATED CIRCUIT DEVICES INCLUDING A VERTICAL FIELD-EFFECT TRANSISTOR (VFET) AND METHODS OF FORMING THE SAME

(71) Applicant: Samsung Electronics Co., Ltd., Suwon-si (KR)

(72) Inventors: Young Chai Jung, Suwon-si (KR); Seon Bae Kim, Suwon-si (KR); Seung Hyun Song, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/713,054

(22) Filed: Dec. 13, 2019

(65) Prior Publication Data

US 2020/0403096 A1    Dec. 24, 2020

Related U.S. Application Data

(60) Provisional application No. 62/862,946, filed on Jun. 18, 2019.

(51) Int. Cl.
| | |
|---|---|
| *H01L 29/66* | (2006.01) |
| *H01L 29/78* | (2006.01) |
| *H01L 29/417* | (2006.01) |
| *H01L 27/085* | (2006.01) |

(52) U.S. Cl.
CPC ........ *H01L 29/7827* (2013.01); *H01L 27/085* (2013.01); *H01L 29/41791* (2013.01); *H01L 29/66666* (2013.01)

(58) Field of Classification Search
CPC ......... H01L 29/66666; H01L 29/66787; H01L 29/7827; H01L 29/78642
See application file for complete search history.

(56) References Cited

U.S. PATENT DOCUMENTS

| | | | |
|---|---|---|---|
| 6,005,271 A | * | 12/1999 | Hshieh ................ H01L 29/0696 257/331 |
| 7,741,184 B2 | | 6/2010 | Anderson et al. |
| 9,496,259 B2 | | 11/2016 | Chien et al. |
| 9,608,098 B2 | | 3/2017 | Shrivastava et al. |
| 9,865,603 B2 | | 1/2018 | Zang et al. |
| 9,964,605 B2 | | 5/2018 | Chi et al. |
| 2013/0214332 A1 | | 8/2013 | Wu |
| 2019/0148516 A1 | | 5/2019 | Zhang et al. |

* cited by examiner

*Primary Examiner* — Mark V Prenty
(74) *Attorney, Agent, or Firm* — Myers Bigel, P.A.

(57) ABSTRACT

Integrated circuit devices and methods of forming the same are provided. Integrated circuit devices may include a vertical field-effect transistor (VFET) that includes a bottom source/drain region in a substrate, a channel region on the bottom source/drain region, a top source/drain region on the channel region, and a gate structure on a side of the channel region. The channel region may have a cross-shaped upper surface.

20 Claims, 38 Drawing Sheets

FIG. 5A
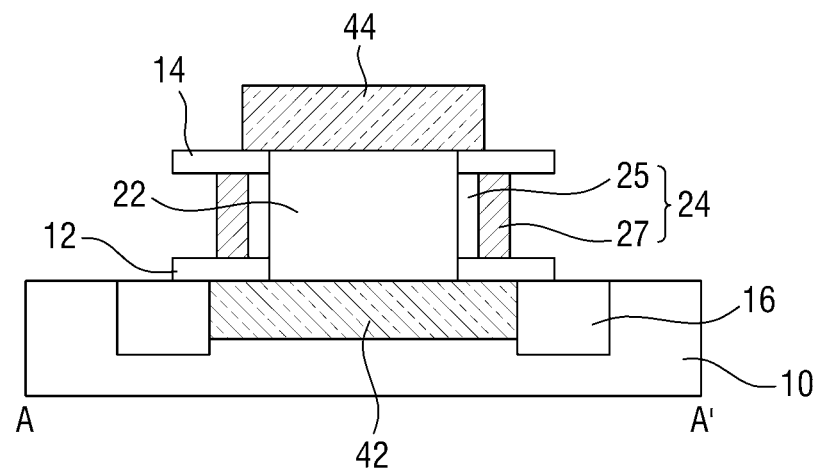
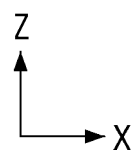
FIG. 5B
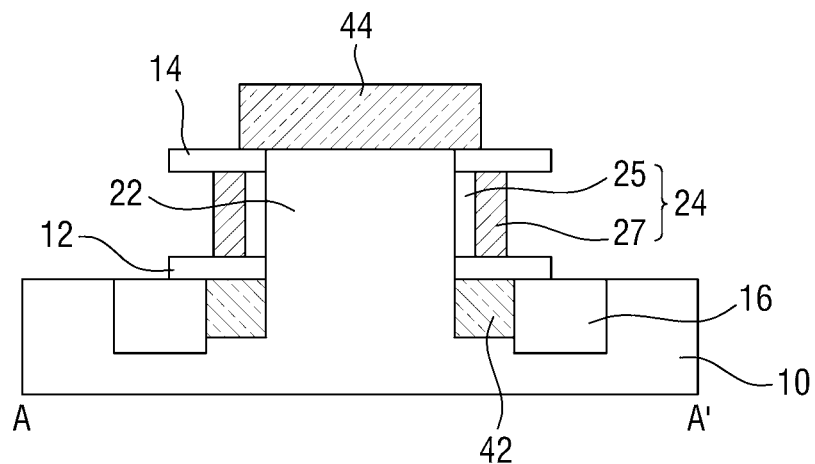
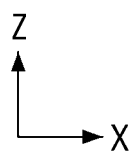

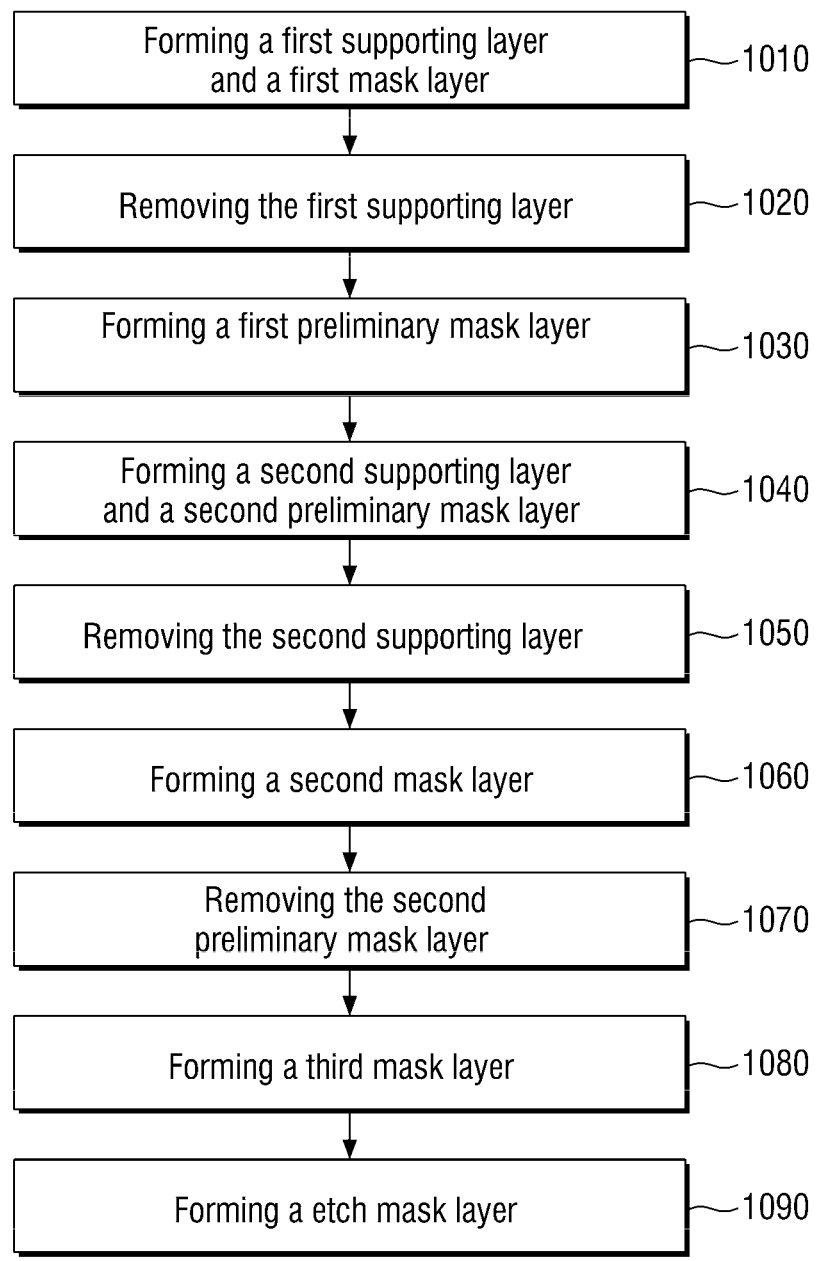

FIG. 11A
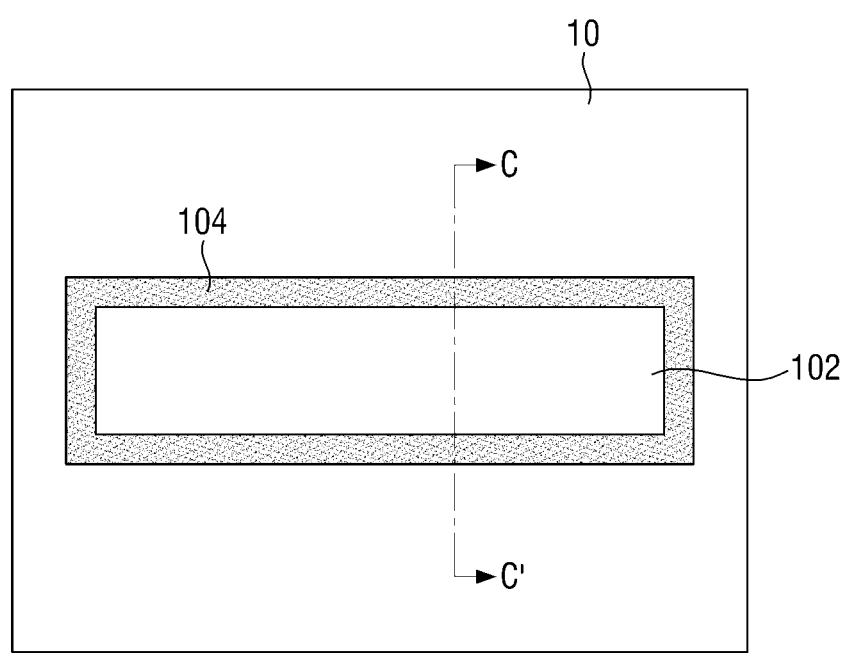
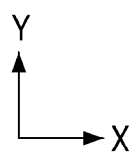

FIG. 11B
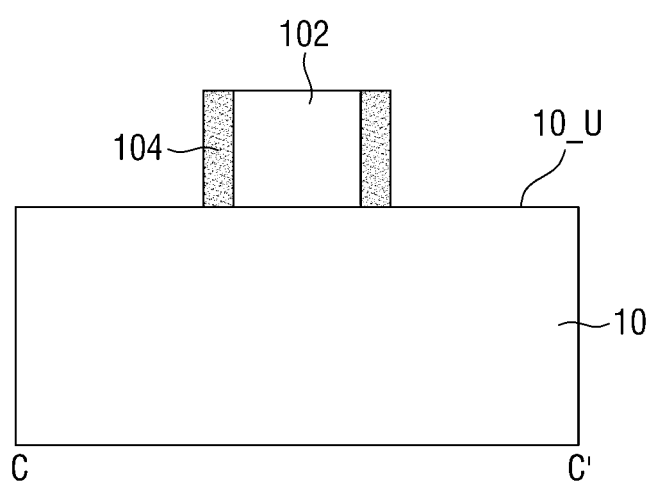
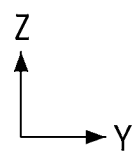

FIG. 12B
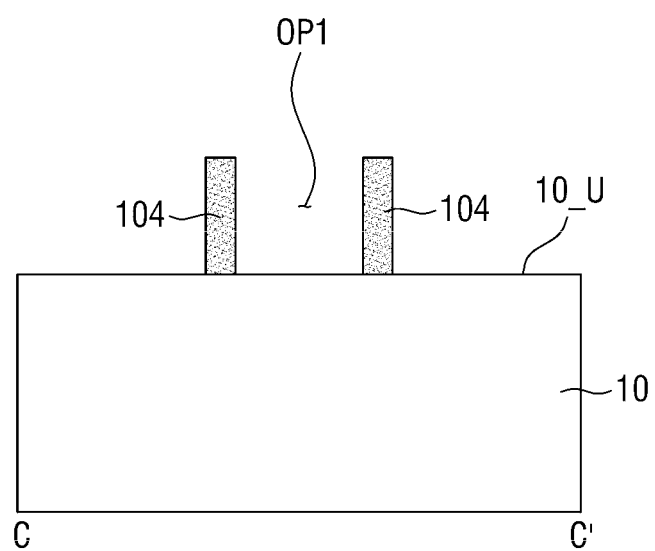
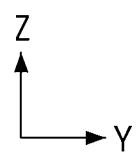

FIG. 14A
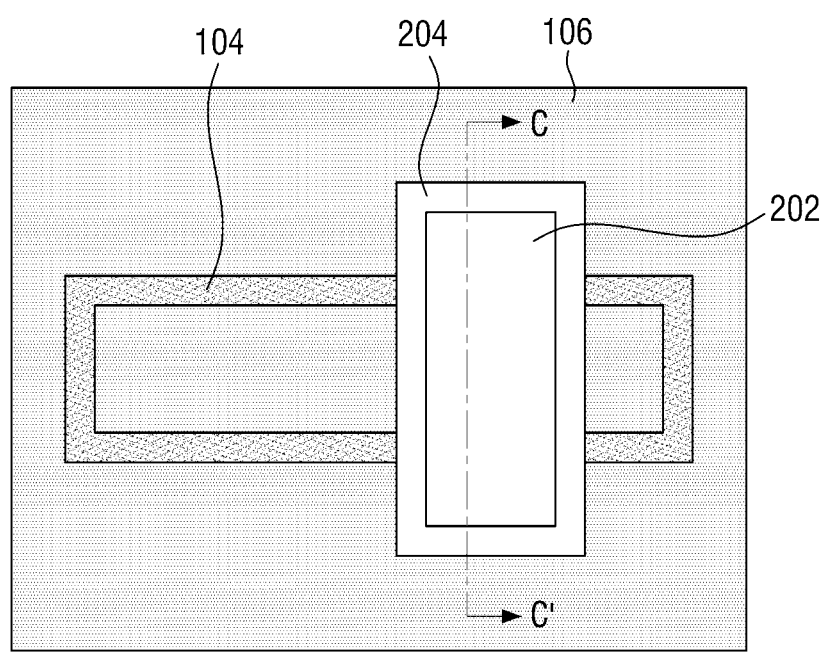
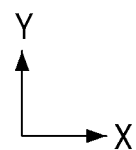

FIG. 16A
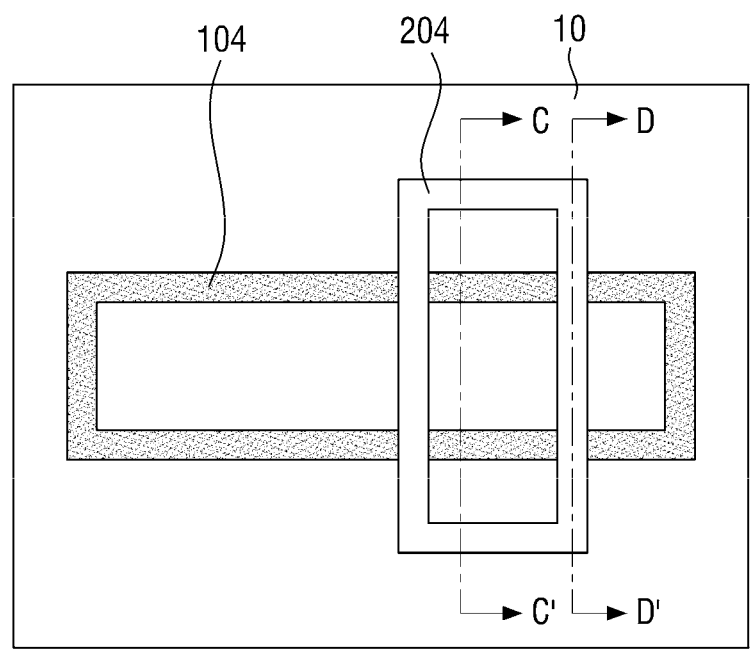
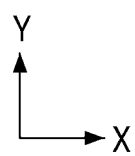

FIG. 17C
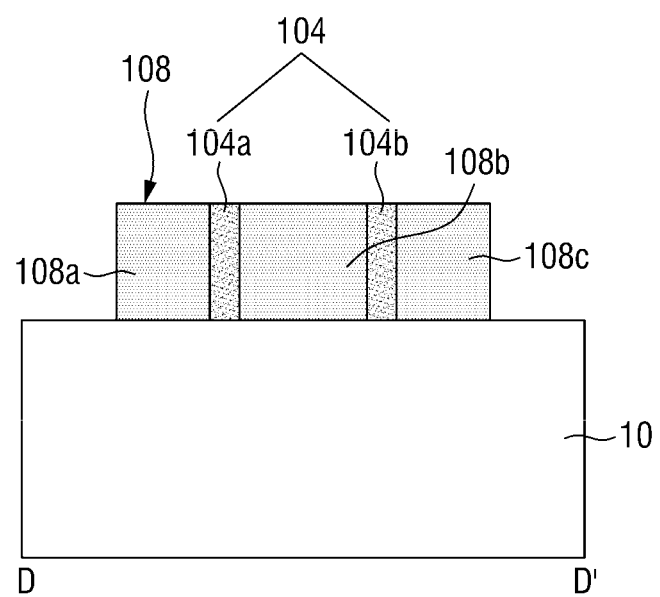
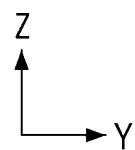

FIG. 19C
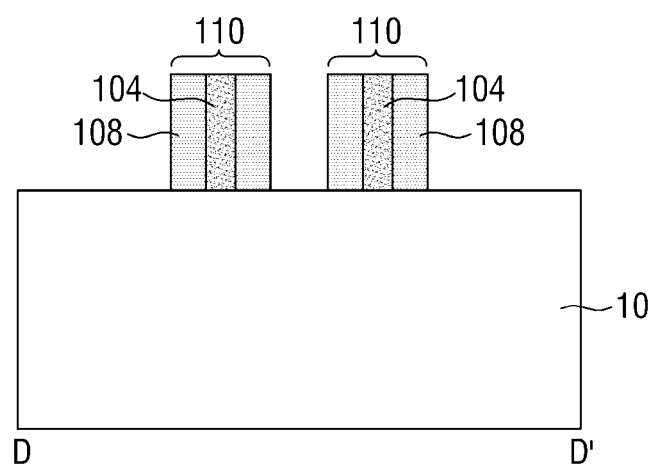
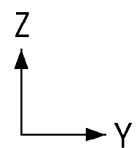

FIG. 20B
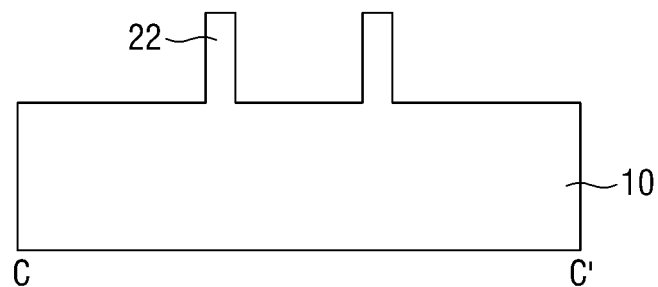
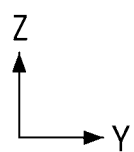
FIG. 20C
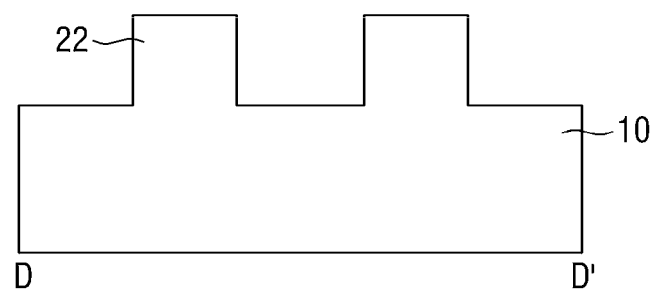
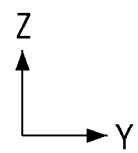

INTEGRATED CIRCUIT DEVICES INCLUDING A VERTICAL FIELD-EFFECT TRANSISTOR (VFET) AND METHODS OF FORMING THE SAME

CROSS-REFERENCE TO RELATED APPLICATION

This application claims priority to U.S. Provisional Application Ser. No. 62/862,946, entitled VFET STRUCTURE WITH CROSS SHAPED FIN ARRAY, filed in the USPTO on Jun. 18, 2019, the disclosure of which is hereby incorporated by reference herein in its entirety.

FIELD

The present disclosure generally relates to the field of electronics and, more particularly, to vertical field-effect transistor (VFET) devices.

BACKGROUND

Various structures and manufacturing processes of VFET devices have been researched because of their high scalability. It, however, may be difficult to form VFETs having structural stability.

SUMMARY

According to some embodiments of the present inventive concept, integrated circuit device may include a vertical field-effect transistor (VFET) that includes a bottom source/drain region in a substrate, a channel region on the bottom source/drain region, a top source/drain region on the channel region, and a gate structure on a side of the channel region. The channel region may have a cross-shaped upper surface.

According to some embodiments of the present inventive concept, integrated circuit device may include a vertical field-effect transistor (VFET) that includes a bottom source/drain region in a substrate, a channel region on the substrate, a top source/drain region on the channel region, and a gate structure on a side of the channel region. The channel region may include a core portion, a first pair of protruding portions, and a second pair of protruding portions. The first pair of protruding portions may protrude toward respective opposite directions from the core portion along a first horizontal direction, and the second pair of protruding portions may protrude toward respective opposite directions from the core portion along a second horizontal direction. The first horizontal direction and the second horizontal direction may be parallel to an upper surface of the substrate and may be different from each other. The channel region may be between the bottom source/drain region and the top source/drain region.

According to some embodiments of the present inventive concept, integrated circuit device may include a vertical field-effect transistor (VFET) that includes a bottom source/drain region in a substrate, a channel region on the bottom source/drain region, a top source/drain region on the channel region, and a gate structure on a side of the channel region. The top source/drain region may include a cross-shaped upper surface, and the channel region may be between the bottom source/drain region and the top source/drain region.

According to some embodiments of the present inventive concept, methods of forming a vertical field-effect transistor (VFET) may include providing a substrate and forming a first mask layer and a second mask layer on the substrate. The first mask layer may include a plurality of first portions that are spaced apart from each other in a first horizontal direction, and each of the plurality of first portions may have a line shape extending in a second horizontal direction. The first horizontal direction and the second horizontal direction may be parallel to an upper surface of the substrate and may be different from each other. The second mask layer may include a plurality of second portions that are spaced apart from each other in the second horizontal direction and may be arranged along the second horizontal direction, and each of the plurality of second portions may connect two adjacent ones of the plurality of first portions. The methods may also include forming an etch mask layer by removing portions of the first mask layer and the second mask layer. The etch mask layer may include a cross-shaped upper surface. The methods further include forming a channel region of the VFET by etching the substrate using the etch mask layer as an etch mask.

BRIEF DESCRIPTION OF THE DRAWINGS

FIGS. 5A and 5B are detailed views of the cross-sectional view of FIG. 2 according to some embodiments of the present inventive concept.

FIG. 10 is a flow chart of methods of forming a channel region of a VFET according to some embodiments of the present inventive concept.

FIGS. 11A through 20C are views illustrating the methods according to the flow chart of FIG. 10. FIGS. 11A, 12A, 13A, 14A, 15A, 16A, 17A, 18A, 19A, and 20A are plan views, FIGS. 11B, 12B, 13B, 14B, 15B, 16B, 17B, 18B, 19B, and 20B are cross-sectional views taken along the line C-C' in FIGS. 11A, 12A, 13A, 14A, 15A, 16A, 17A, 18A, 19A, and 20A, respectively, and FIGS. 15C, 16C, 17C, 18C, 19C, and 20C are cross-sectional views taken along the line D-D' in 15A, 16A, 17A, 18A, 19A, and 20A, respectively.

DETAILED DESCRIPTION

According to some embodiments of the present inventive concept, a channel region of a VFET may include a cross-shaped upper surface, and thus the VFET may have a wider channel width and may be structurally stable. For example, a shape of the channel region of the VFET may reduce the likelihood of structural collapse of the channel region during fabrication processes. This structural stability may be particularly beneficial when the VFET has a big height, for example, when the VFET is a stacked VFET including two transistors stacked in a vertical direction.

According to some embodiments of the present inventive concept, channel regions having various shapes, including a cross shape and a line shape, can be formed using a single etch mask layer.

Figure 1:
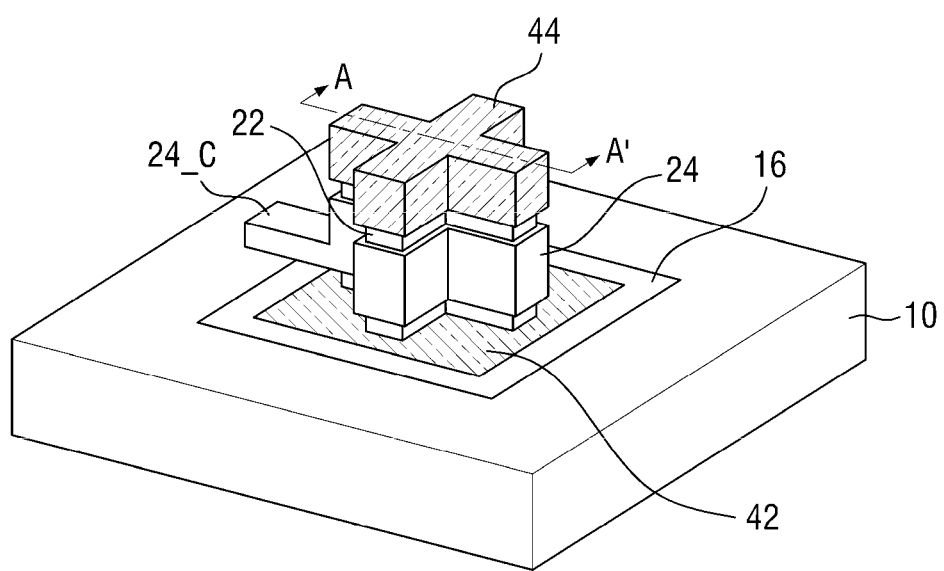
FIG. 1 is a perspective view of a VFET according to some embodiments of the present inventive concept.
Figure 2:
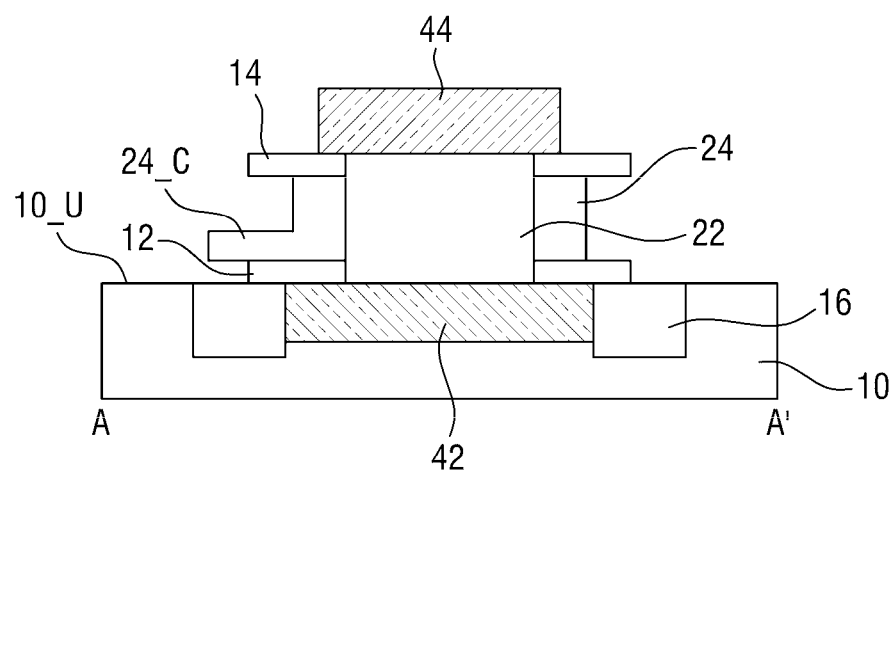
FIG. 2 is a cross-sectional view of the VFET of FIG. 1 taken along the line A-A'.

FIG. 1 is a perspective view of a VFET according to some embodiments of the present inventive concept, and FIG. 2 is a cross-sectional view of the VFET taken along the line A-A'. For simplicity of illustration, FIG. 1 does not show some elements of the VFET (e.g., a first spacer 12 and a second spacer 14 in FIG. 2).

Referring to FIGS. 1 and 2, the VFET may include a bottom source/drain region 42 in a substrate 10. The substrate 10 may include one or more semiconductor materials, for example, Si, Ge, SiGe, GaP, GaAs, SiC, SiGeC and/or InP. In some embodiments, the substrate 10 may be a bulk substrate (e.g., a bulk silicon substrate) or a semiconductor on insulator (SOI) substrate.

A device isolation layer 16 may be provided between the bottom source/drain region 42 and the substrate 10 for electrical isolation therebetween. The device isolation layer 16 may include an insulating material (e.g., silicon oxide, silicon nitride, and/or silicon oxynitride).

The VFET may also include a channel region 22 and a top source/drain region 44 sequentially stacked on the substrate 10 in a vertical direction Z. The vertical direction Z may be perpendicular to an upper surface 10_U of the substrate 10. The channel region 22 may be between the bottom source/drain region 42 and the top source/drain region 44. The bottom source/drain region 42 and the top source/drain region 44 may be spaced apart from each other in the vertical direction Z. Each of the bottom source/drain region 42 and the top source/drain region 44 may include a semiconductor material and/or dopant atoms (e.g., boron atoms, phosphorus atoms, arsenic atoms).

The VFET may further include a gate structure 24 on a side of the channel region 22, a first spacer 12, and a second spacer 14. The gate structure 24 may include a gate contact portion 24_C to which a conductive layer is connected to apply a gate voltage to the gate structure 24. Each of the first and second spacers 12 and 14 may include an insulating material (e.g., silicon oxide, silicon nitride, and/or silicon oxynitride). The first spacer 12 may be provided for electrical isolation between the bottom source/drain region 42 and the gate structure 24, and the second spacer 14 may be provided for electrical isolation between the gate structure 24 and the top source/drain region 44.

Figure 3A:
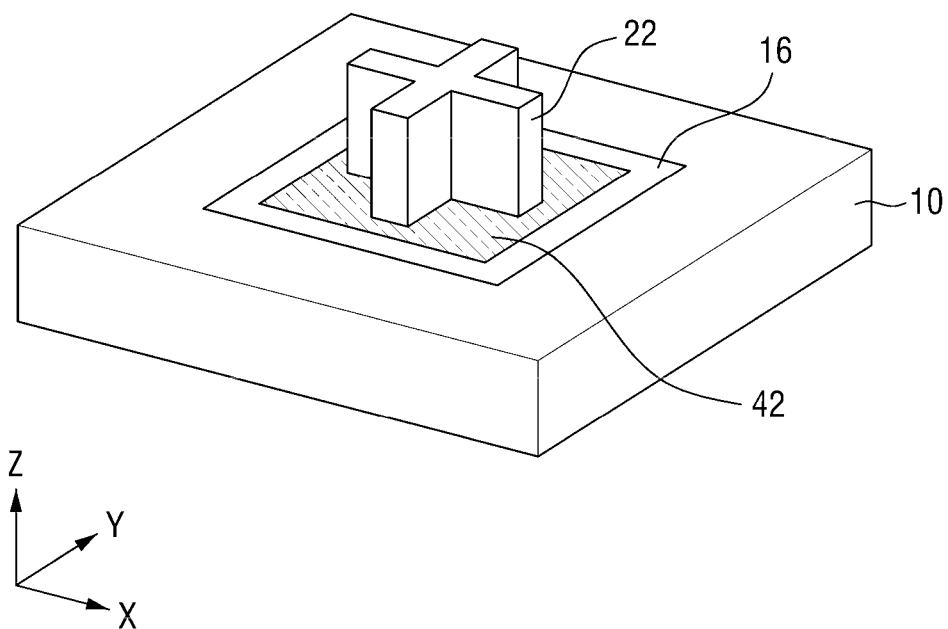
FIGS. 3A and 3B are perspective views showing elements of the VFET in FIG. 1 separately.
Figure 3B:
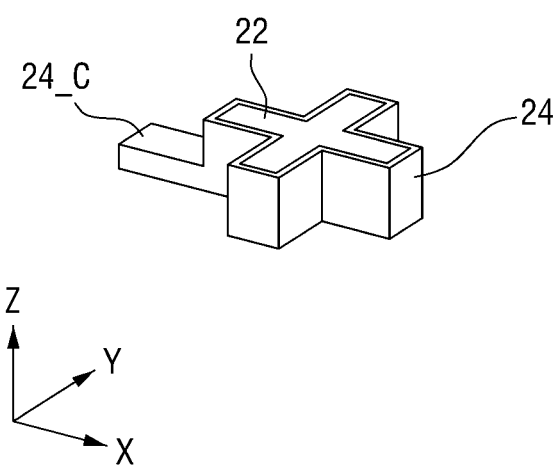

FIGS. 3A and 3B are perspective views showing elements of the VFET in FIG. 1 separately. Referring to FIGS. 1 and 3A, the channel region 22 may have a cross-shaped upper surface and may protrude from the bottom source/drain region 42 in the vertical direction Z. In some embodiment, the channel region 22 may also have a cross-shaped lower surface. The channel region 22 may include a material that is the same as the substrate 10 or different from the substrate 10.

Referring again to FIGS. 1 and 2, the top source/drain region 44 may also have a cross-shaped upper surface. The top source/drain region 44 may vertically overlap the channel region 22. In some embodiments, the cross-shaped upper surface of the top source/drain region 44 may vertically overlap an entirety of the cross-shaped upper surface of the channel region 22 as illustrated in FIG. 1. Although FIG. 1 shows that the cross-shaped upper surface of the top source/drain region 44 has a greater area than an area of the cross-shaped upper surface of the channel region 22, the present inventive concept is not limited thereto. In some embodiments, the cross-shaped upper surface of the top source/drain region 44 may have smaller area than the area of the cross-shaped upper surface of the channel region 22 and may not vertically overlap an entirety of the cross-shaped upper surface of the channel region 22. In some embodiments, the cross-shaped upper surface of the top source/drain region 44 may have the same area as the area of the cross-shaped upper surface of the channel region 22.

It will be understood that references herein to "an element A vertically overlapping an element B" (or similar language) means that a vertical line exists that intersects both the elements A and B.

Referring to FIGS. 1 and 3B, the gate structure 24 may enclose (e.g., completely enclose) the channel region 22. The gate structure 24 may have a uniform thickness along a side of the channel region 22 as illustrated in FIG. 3B. In some embodiments, the gate contact portion 24_C may be omitted.

Figure 4:
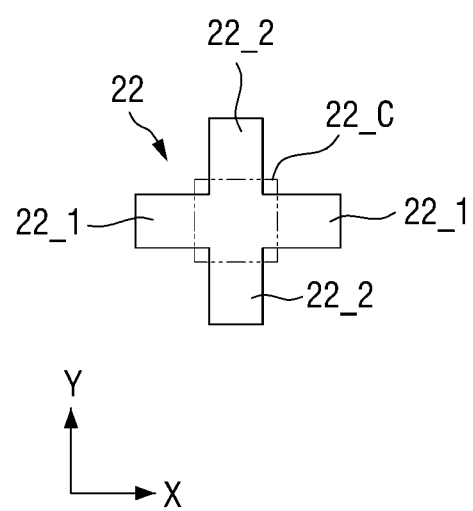
FIG. 4 is a plan view of the channel region of the VFET in FIG. 1.

FIG. 4 is a plan view of the channel region 22. Referring to FIG. 4, the channel region 22 may include a core portion 22_C, a first pair of protruding portions 22_1, and a second pair of protruding portions 22_2. The first pair of protruding portions 22_1 may protrude toward respective opposite directions from the core portion 22_C along a first horizontal direction X, and the second pair of protruding portions 22_2 may protrude toward respective opposite directions from the core portion 22_C along a second horizontal direction Y. The first horizontal direction X and the second horizontal direction Y may be parallel to the upper surface 10_U (FIG. 2) of the substrate 10 and may be different from each other. In some embodiments, the first horizontal direction X may be perpendicular to the second horizontal direction Y.

FIGS. 5A and 5B are detailed views of the cross-sectional view of FIG. 2 according to some embodiments of the present inventive concept. Referring to FIGS. 5A and 5B, the gate structure 24 may include a gate insulator 25 and a gate electrode 27. The gate insulator 25 may be between the channel region 22 and the gate electrode 27 to electrically isolate the channel region 22 from the gate electrode 27. Each of the gate insulator 25 and the gate electrode 27 may include multiple layers therein. The gate insulator 25 may include, for example, a silicon oxide layer, a silicon oxynitride layer, and/or a high k material layer that has a dielectric constant greater than silicon dioxide. The gate electrode 27 may include a work function controlling layer (e.g., a titanium nitride layer, a tantalum nitride layer), a diffusion barrier layer, and/or a conductive layer (e.g., a semiconductor layer, a metal layer). In some embodiments, the gate electrode 27 may enclose (e.g., completely enclose) the channel region 22.

In some embodiments, the channel region 22 may vertically overlap the bottom source/drain region 42, as illustrated in FIG. 5A. In some embodiments, the channel region 22 may be connected to the substrate 10, and the bottom source/drain region 42 may be on a side of the channel region 22, as illustrated in FIG. 5B.

Figure 6:
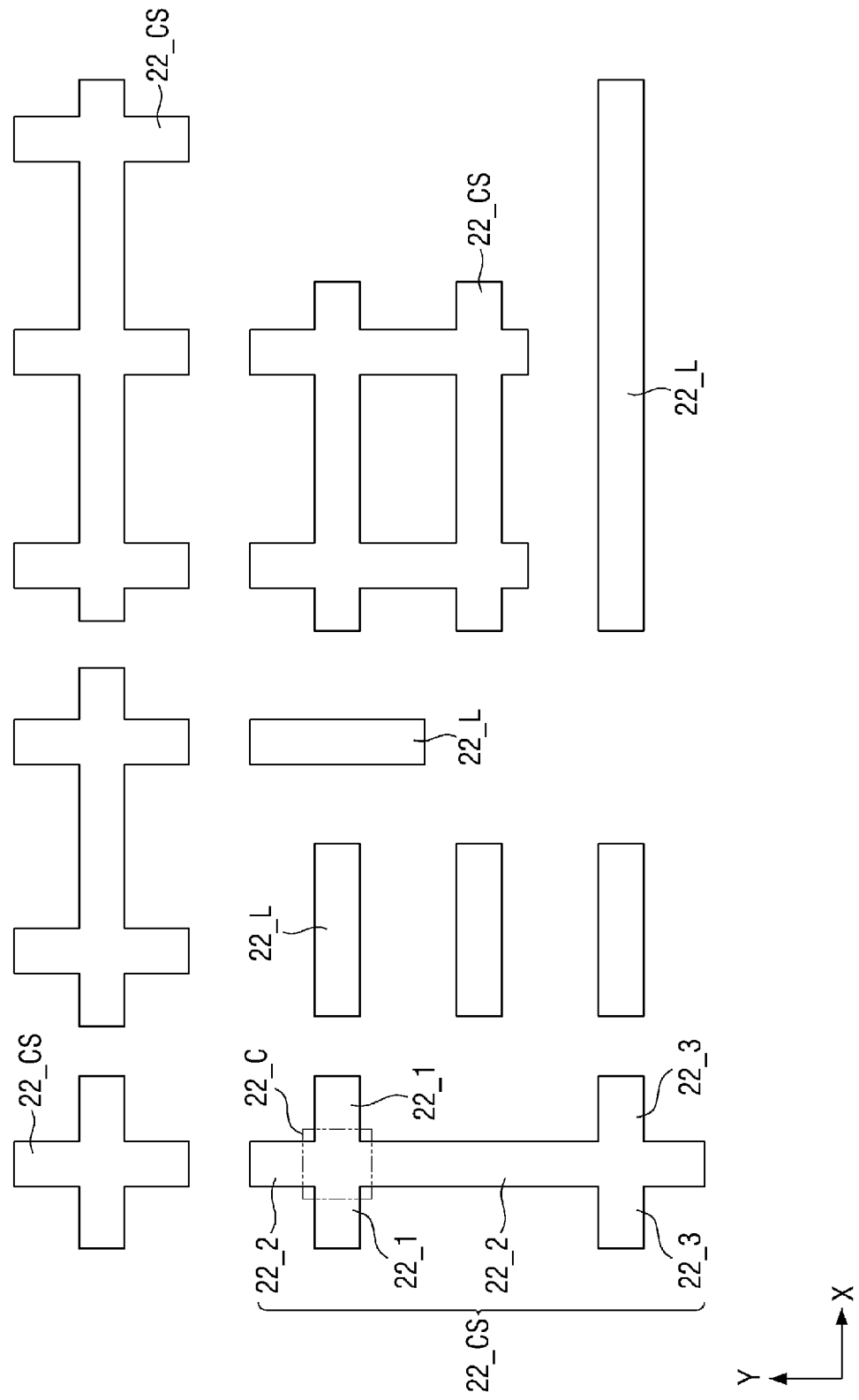
FIG. 6 is a plan view showing channel regions of VFETs in a single integrated circuit device.

FIG. 6 is a plan view showing channel regions of VFETs in a single integrated circuit device. For simplicity of illustration, only the channel regions of the VFETs are shown but it will be understood that each of the VFETs includes other elements shown in FIGS. 1 and 2.

Referring to FIG. 6, some of the channel regions (i.e., 22_L) of the VFETs may have a line-shaped upper surface. Each of these channel regions having a line shape (i.e., 22_L) consists of a portion extending longitudinally in a single direction (e.g., the first horizontal direction X or the second horizontal direction Y) and may not include protruding portions.

Some of the channel regions (i.e., 22_CS) of the VFETs may include a portion or portions having a cross-shaped upper surface. In some embodiments, these channel regions 22_CS may include two portions, each of which has a cross-shaped upper surface. For example, each channel region 22_CS may include a core portion 22_C, a first pair of protruding portions 22_1, a second pair of protruding portions 22_2, and a third pair of protruding portions 22_3. The first pair of protruding portions 22_1 may protrude toward respective opposite directions from the core portion 22_C along the first horizontal direction X, the second pair of protruding portions 22_2 may protrude toward respective opposite directions from the core portion 22_C along the second horizontal direction Y, and the third pair of protruding portions 22_3 may protrude toward respective opposite directions from a portion of one of the second pair of protruding portions 22_2 along the first horizontal direction X. In some embodiments, the second pair of protruding portions 22_2 may have different lengths in the second horizontal direction Y as illustrated in FIG. 6.

Figure 7:
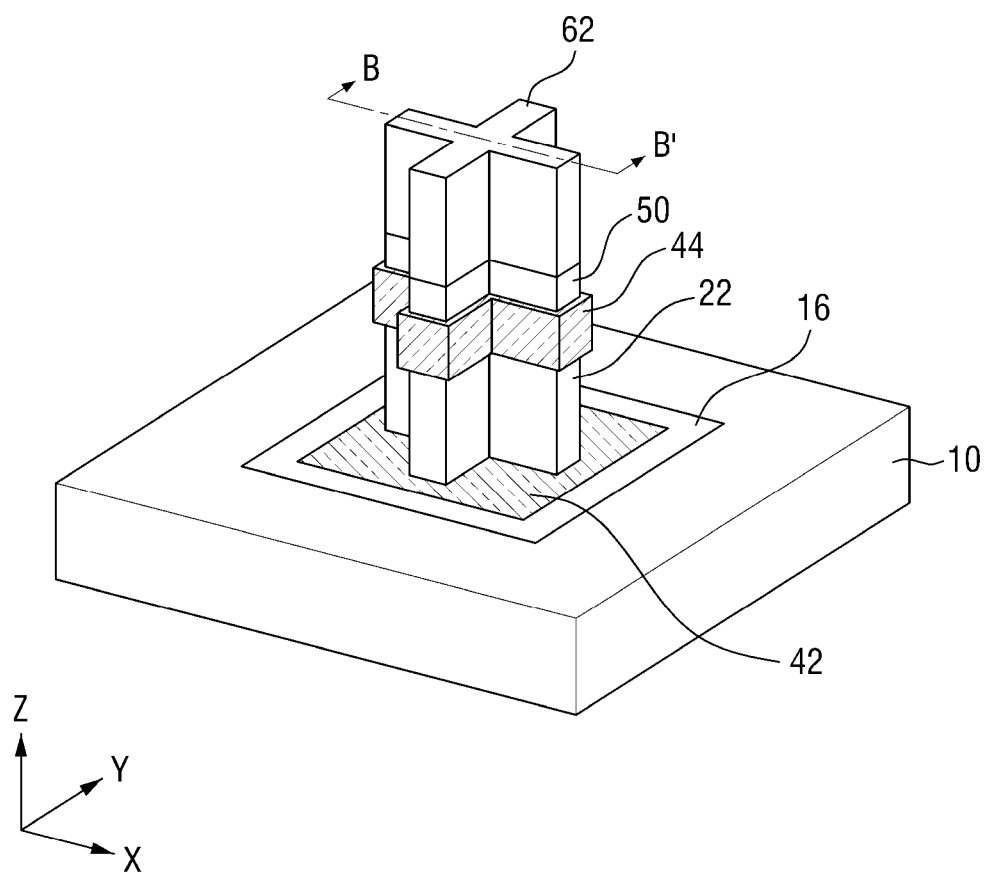
FIG. 7 is a perspective view of a stacked VFET device according to some embodiments of the present inventive concept.
Figure 8:
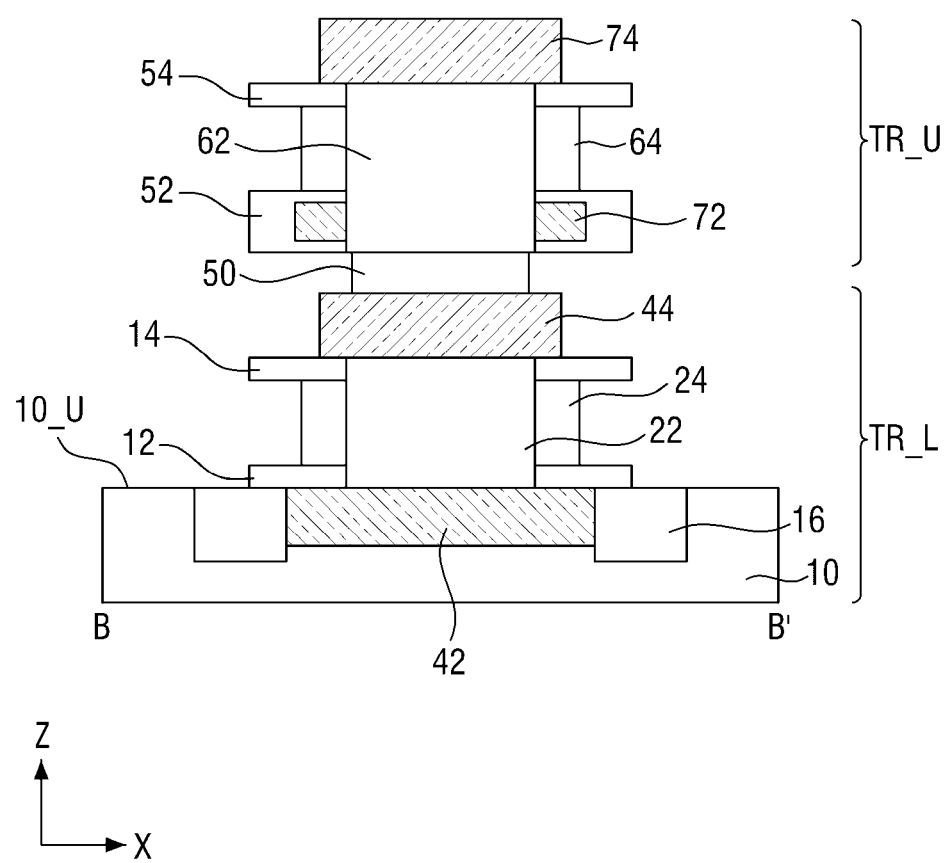
FIG. 8 is a cross-sectional view of the stacked VFET device of FIG. 7 taken along the line B-B'.

FIG. 7 is a perspective view of a stacked VFET device according to some embodiments of the present inventive concept, and FIG. 8 is a cross-sectional view of the stacked VFET device of FIG. 7 taken along the line B-B'. For simplicity of illustration, FIG. 7 shows selected elements of the stacked VFET device.

Referring to FIGS. 7 and 8, the stacked VFET device may include two VFETs (i.e., a lower VFET TR_L and an upper VFET TR_U) stacked in the vertical direction Z. In some embodiments, the lower VFET TR_L and the upper VFET TR_U may be transistors of a single inverter. For example, the lower VFET TR_L may be an n-type transistor of an inverter, and the upper VFET TR_U may be a p-type transistor of the inverter. Accordingly, the inverter may have a smaller footprint by vertically stacking two VFETs. The lower VFET TR_L may have a structure the same as or similar to the VFET shown in FIGS. 1 and 2.

The upper VFET TR_U may include an upper bottom source/drain region 72, an upper channel region 62, and an upper top source/drain region 74 sequentially stacked on the lower VFET TR_L. The upper VFET TR_U may also include a third spacer 52 and a fourth spacer 54. The third spacer 52 may be provided for electrical isolation between the upper bottom source/drain region 72 and the upper channel region 62, and the fourth spacer 54 may be provided for electrical isolation between the upper channel region 62 and the upper top source/drain region 74. The stacked VFET device may also include an insulating layer 50 between the lower VFET TR_L and the upper VFET TR_U. The insulating layer 50 may be provided for electrical isolation between the channel region 22 and the upper channel region 62.

Each of the upper bottom source/drain region 72 and the upper top source/drain region 74 may include a semiconductor material and/or dopant atoms (e.g., boron atoms, phosphorous atoms, arsenic atoms). The upper channel region 62 may include a material that is the same as the substrate 10 or different from the substrate 10. In some embodiments, the upper channel region 62 may include a material the same as that of the channel region 22. Each of the third spacer 52, the fourth spacer 54, and the insulating layer 50 may include an insulating material (e.g., silicon oxide, silicon nitride, and/or silicon oxynitride).

In some embodiments, the upper channel region 62 may have a cross-shaped upper surface, and the cross-shaped upper surface of the upper channel region 62 and an upper surface of the insulating layer 50 may have the same shape and the same size. Accordingly, the cross-shaped upper surface of the upper channel region 62 and the cross-shaped upper surface of the insulating layer 50 may have the same widths in the first horizontal direction X and the second horizontal direction Y. In some embodiments, the upper surfaces of the upper channel region 62, the insulating layer 50, and the channel region 22 of the lower VFET TR_L may have the same shape and the same size. For example, the upper surfaces of the upper channel region 62 and the channel region 22 may have the same widths in the first horizontal direction X and the second horizontal direction Y.

Figure 9:
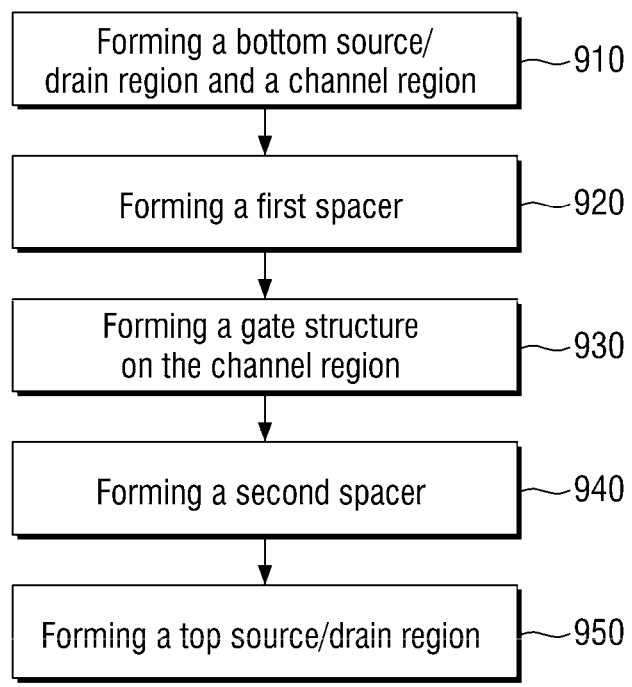
FIG. 9 is a flow chart of methods of forming an integrated circuit device including a VFET according to some embodiments of the present inventive concept.

FIG. 9 is a flow chart of methods of forming an integrated circuit device including a VFET according to some embodiments of the present inventive concept. Referring to FIGS. 2 and 9, the methods include forming a bottom source/drain region 42 and a channel region 22 (Block 910), forming a first spacer 12 (Block 920), forming a gate structure 24 on the channel region 22 (Block 930), forming a second spacer 14 (Block 940), and forming a top source/drain region 44 on the channel region 22 (Block 950). Each of the Blocks may be performed using various processes known in the art.

FIG. 10 is a flow chart of methods of forming a channel region of a VFET according to some embodiments of the present inventive concept, and FIGS. 11A through 20C are views illustrating the methods according to the flow chart of FIG. 10. Specifically, FIGS. 11A, 12A, 13A, 14A, 15A, 16A, 17A, 18A, 19A, and 20A are plan views, FIGS. 11B, 12B, 13B, 14B, 15B, 16B, 17B, 18B, 19B, and 20B are cross-sectional views taken along the line C-C' in FIGS. 11A, 12A, 13A, 14A, 15A, 16A, 17A, 18A, 19A, and 20A, respectively, and FIGS. 15C, 16C, 17C, 18C, 19C, and 20C are cross-sectional views taken along the line D-D' in 15A, 16A, 17A, 18A, 19A, and 20A, respectively.

Referring to FIGS. 10, 11A and 11B, the methods may include forming a first supporting layer 102 on a substrate 10 and a first mask layer 104 on a sidewall of the first supporting layer 102 (Block 1010). The first supporting layer 102 may have a line shape extending longitudinally in a first horizontal direction X. The first horizontal direction X may be parallel to an upper surface 10_U of the substrate 10.

The first mask layer 104 may be formed on the sidewall of the first supporting layer 102 by performing various processes. For example, the first mask layer 104 may be formed by forming a first layer conformally on the first supporting layer 102 and the substrate 10 and then performing an etch process (e.g., a blanket etch process). In some embodiments, the first mask layer 104 may have a uniform thickness on the sidewall of the first supporting layer 102 as illustrated in FIGS. 11A and 11B.

The first supporting layer 102 and the first mask layer 104 may include different materials. For example, the first supporting layer 102 may include poly silicon, silicon nitride, silicon oxide, and/or spin-on organic hardmask material, and the first mask layer 104 may include poly silicon, silicon nitride, and/or silicon oxide. In some embodiments, the first supporting layer 102 may include poly silicon, and the first mask layer 104 may include silicon nitride.

Figure 12A:
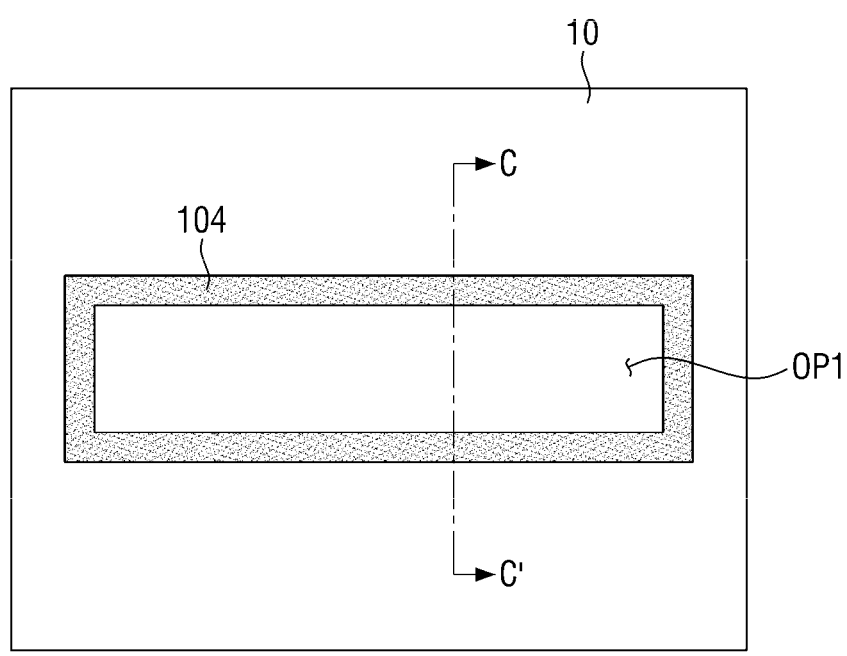

Referring to FIGS. 10, 12A and 12B, the methods may include removing the first supporting layer 102 (Block 1020) by performing, for example, a dry etch process and/or a wet etch process. The first supporting layer 102 may be selectively removed with respect to the first mask layer 104 such that the first mask layer 104 may remain as illustrated in FIGS. 12A and 12B. The first mask layer 104 may define a first opening OP_1 on the substrate 10 after removing the first supporting layer 102. The first opening OP_1 may expose the upper surface 10_U of the substrate 10.

Figure 13A:
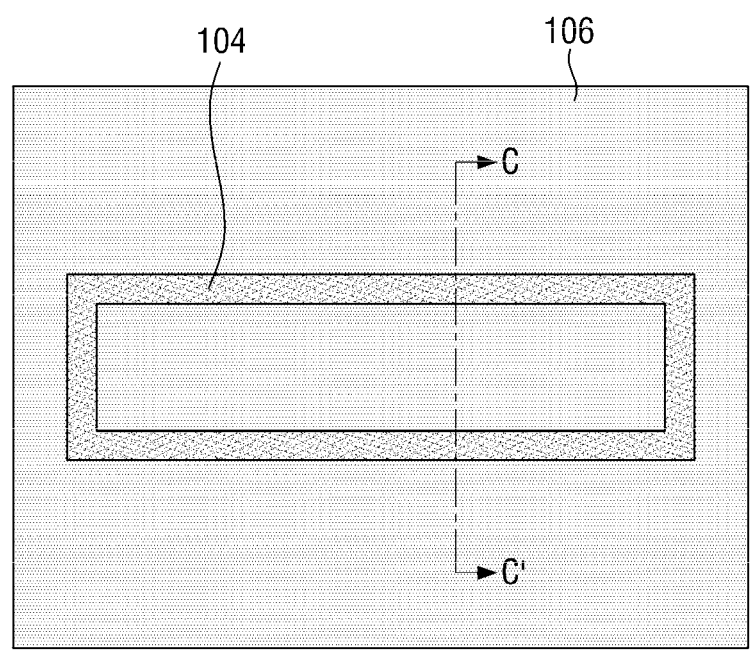
Figure 13B:
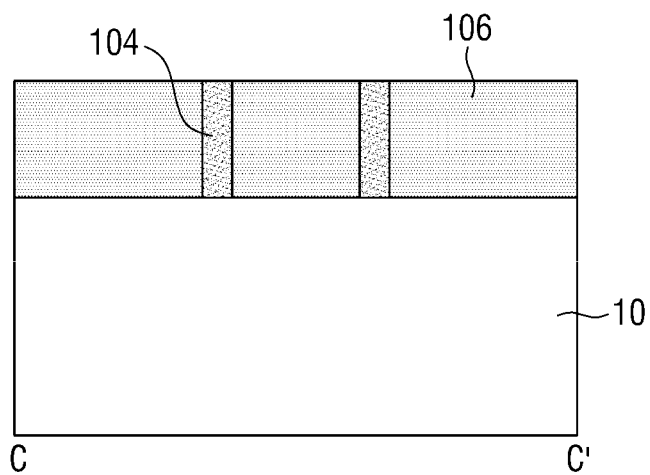

Referring to FIGS. 10, 13A, and 13B, the methods may include forming a first preliminary mask layer 106 on the substrate 10 (Block 1030). The first preliminary mask layer 106 may be formed in the first opening OP_1 of the first mask layer 104 and on the substrate 10. In some embodiments, the first preliminary mask layer 106 may completely fill the first opening OP_1 of the first mask layer 104 as illustrated in FIGS. 13A and 13B. After forming the first preliminary mask layer 106, upper surfaces of the first mask layer 104 and the first preliminary mask layer 106 may be coplanar as illustrated in FIGS. 13A and 13B. In some embodiments, a planarization process may be performed to make the upper surfaces of the first mask layer 104 and the first preliminary mask layer 106 be coplanar.

The first preliminary mask layer 106 may include poly silicon, silicon oxide, and/or spin-on organic hardmask material. In some embodiments, the first preliminary mask layer 106 may include a material different from a material of the first mask layer 104 such that the first preliminary mask layer 106 and the first mask layer 104 may have an etch selectivity with respect to each other while an etch process is being performed.

Figure 14B:
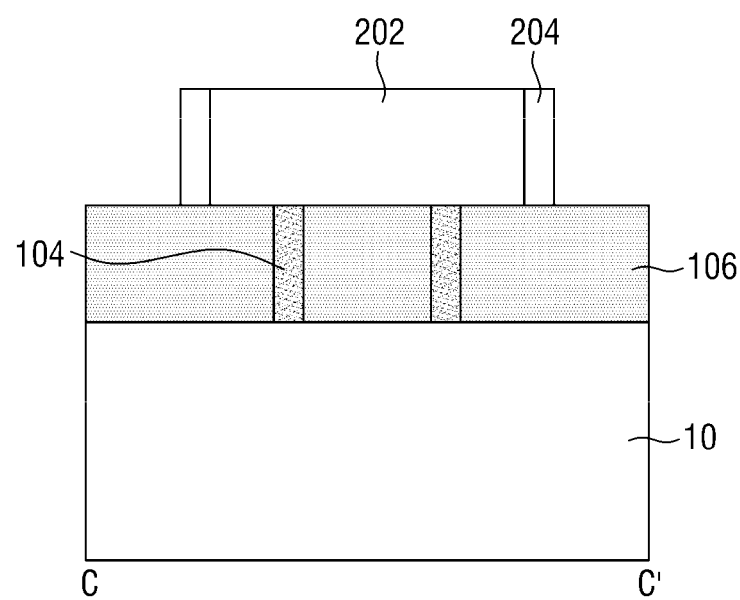

Referring to FIGS. 10, 14A and 14B, the methods may include forming a second supporting layer 202 on the first mask layer 104 and the first preliminary mask layer 106 and forming a second preliminary mask layer 204 on a sidewall of the second supporting layer 202 (Block 1040). The second supporting layer 202 may have a line shape extending longitudinally in a second horizontal direction Y. The second horizontal direction Y may be parallel to the upper surface 10_U of the substrate 10 and may be different from the first horizontal direction X. In some embodiments, the first horizontal direction X may be perpendicular to the second horizontal direction Y.

The second preliminary mask layer 204 may be formed on the sidewall of the second supporting layer 202 by performing various processes. For example, the second preliminary mask layer 204 may be formed by forming a second layer conformally on the second supporting layer 202, the first mask layer 104, and the first preliminary mask layer 106 and then performing an etch process (e.g., a blanket etch process). In some embodiments, the second preliminary mask layer 204 may have a uniform thickness on the sidewall of the second supporting layer 202 as illustrated in FIGS. 14A and 14B.

The second supporting layer 202 may include, for example, poly silicon, silicon nitride, silicon oxide, and/or spin-on organic hardmask layer, and the second preliminary mask layer 204 may include, for example, poly silicon, silicon nitride, and/or silicon oxide. In some embodiments, the second supporting layer 202 and the second preliminary mask layer 204 may include different materials such that the second supporting layer 202 and the second preliminary mask layer 204 may have an etch selectivity with respect to each other while an etch process is being performed.

Figure 15A:
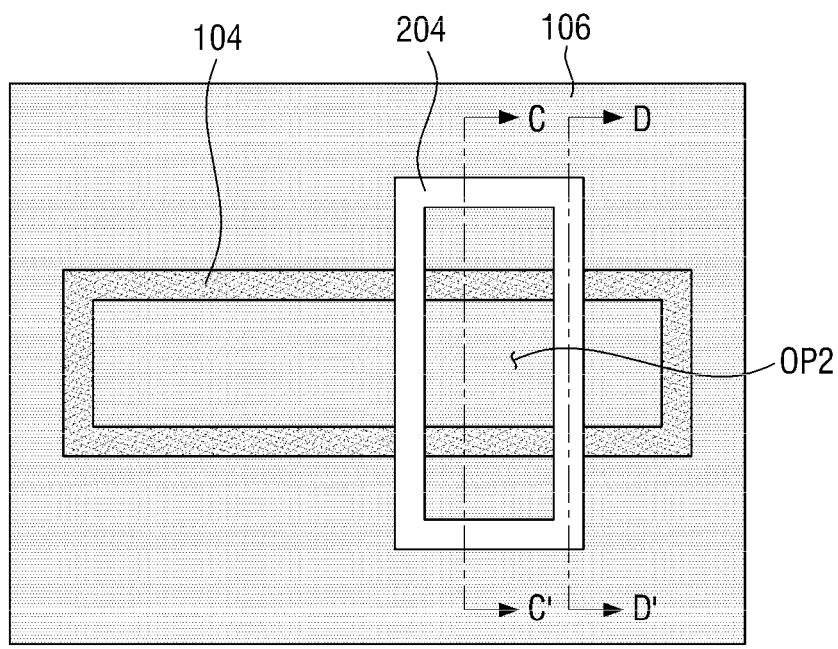
Figure 15B:
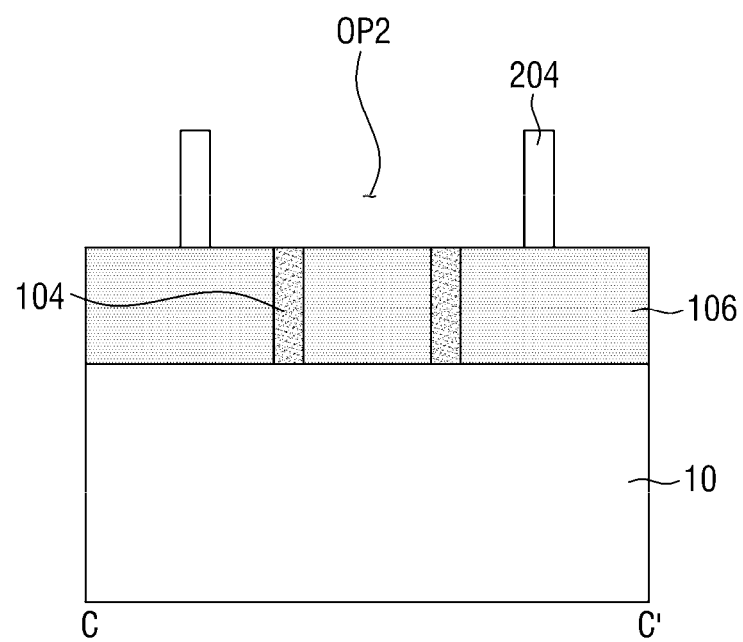
Figure 15C:
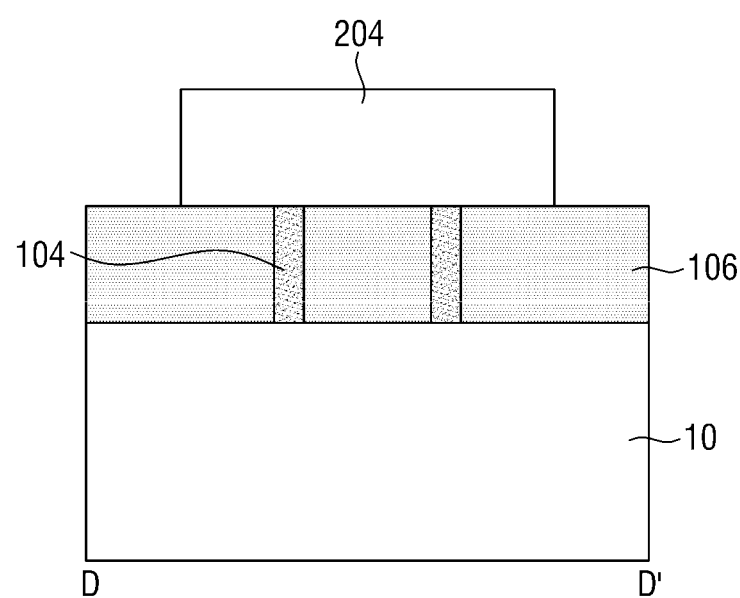
Figure 16B:
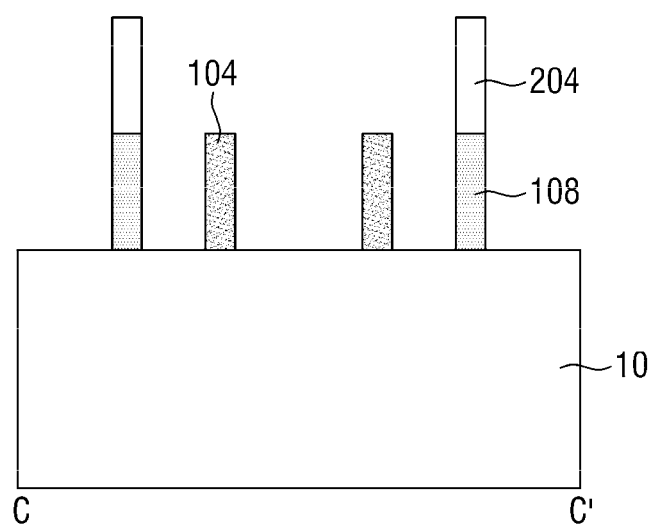
Figure 16C:
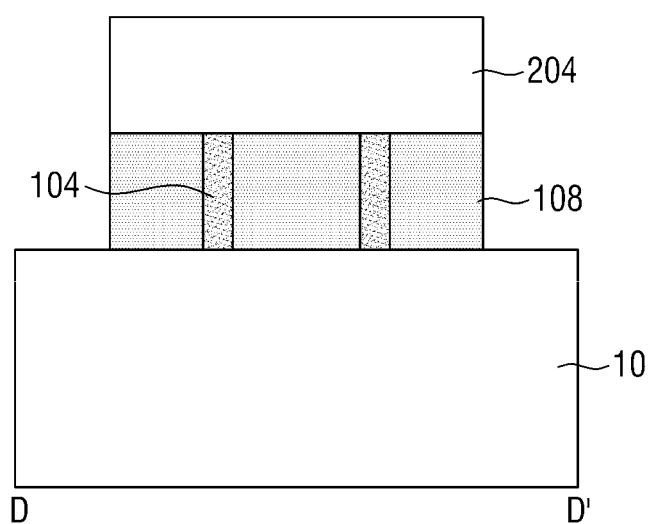

Referring to FIGS. 10, 15A, 15B, and 15C, the methods may include removing the second supporting layer 202 (Block 1050) by performing, for example, a dry etch process and/or a wet etch process. The second preliminary mask layer 204 may define a second opening OP_2 on the first mask layer 104 and the first preliminary mask layer 106 after removing the second supporting layer 202. The second supporting layer 202 may be selectively removed with respect to the second preliminary mask layer 204 such that the second preliminary mask layer 204 may remain as illustrated in FIGS. 15A, 15B, and 15C. In some embodiments, the second opening OP_2 may expose upper surfaces of the first mask layer 104 and the first preliminary mask layer 106, as illustrated in FIG. 15B.

Referring to FIGS. 10, 16A, 16B, and 16C, the methods may include forming a second mask layer 108 (Block 1060) by performing, for example, a dry etch process and/or a wet etch process on the first preliminary mask layer 106 using the second preliminary mask layer 204 as an etch mask.

Figure 17A:
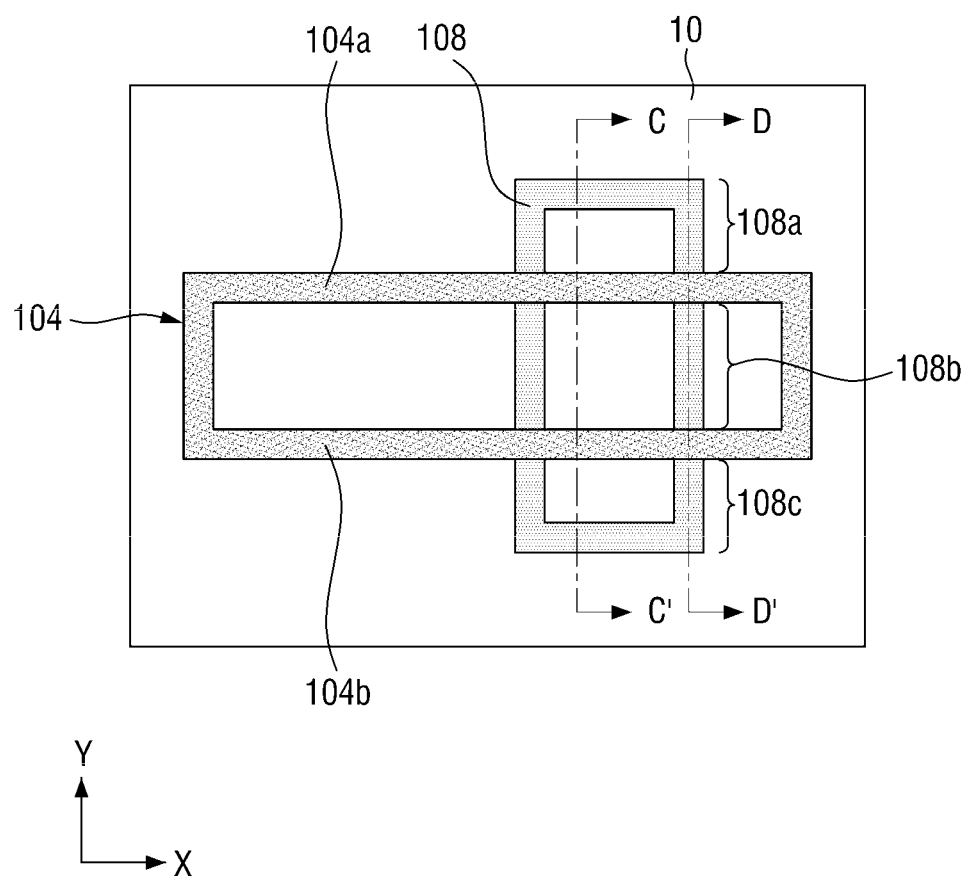
Figure 17B:
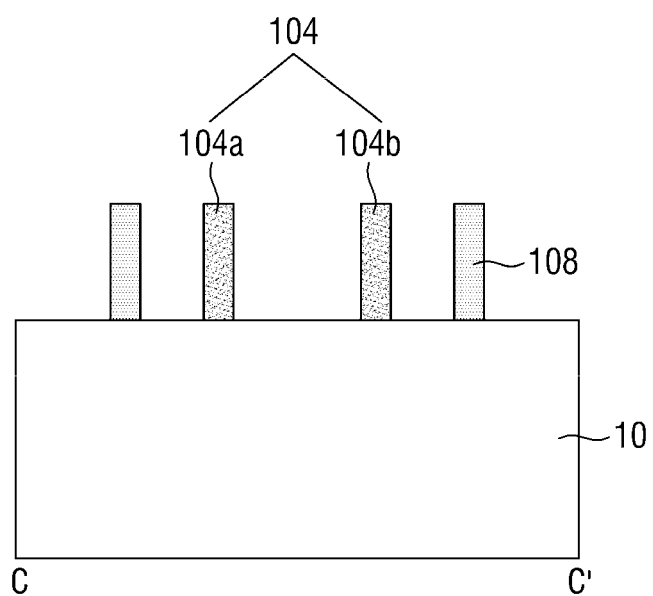
Figure 18A:
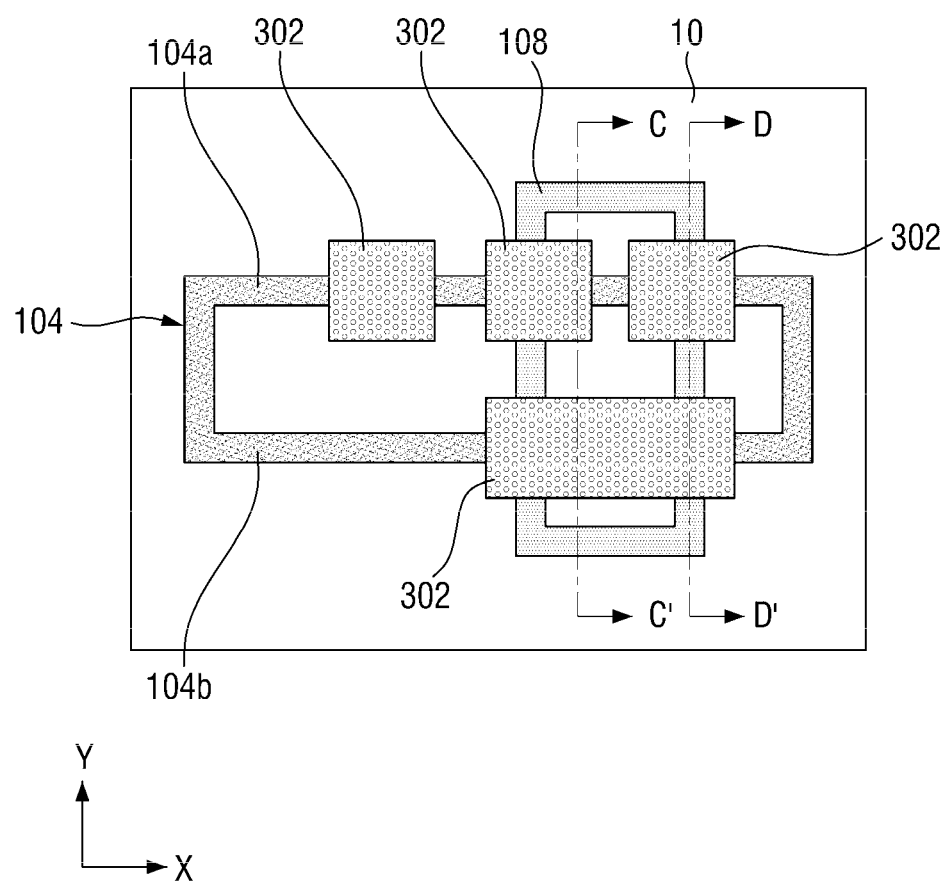
Figure 18B:
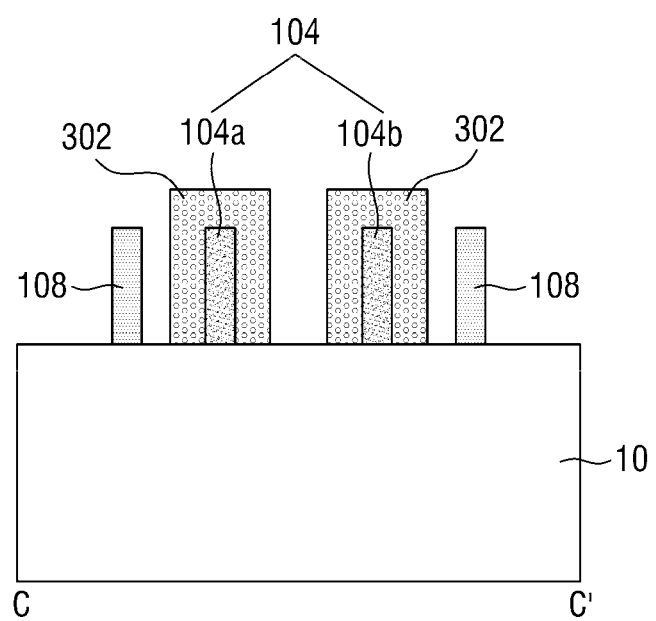
Figure 18C:
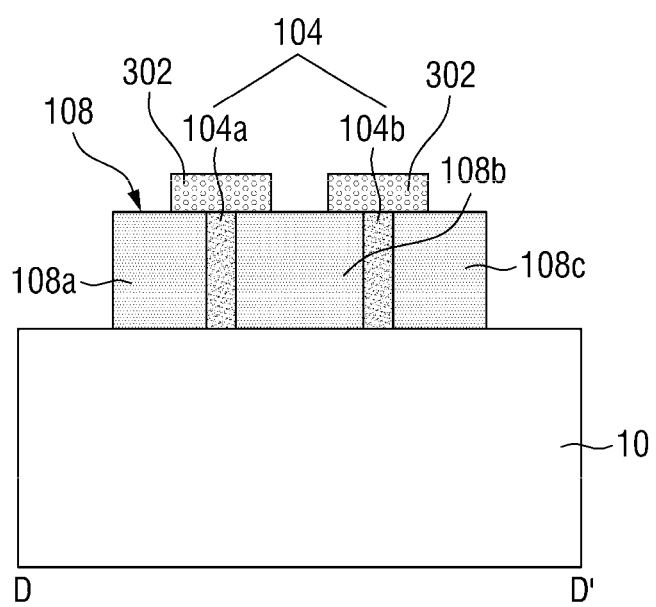
Figure 19A:
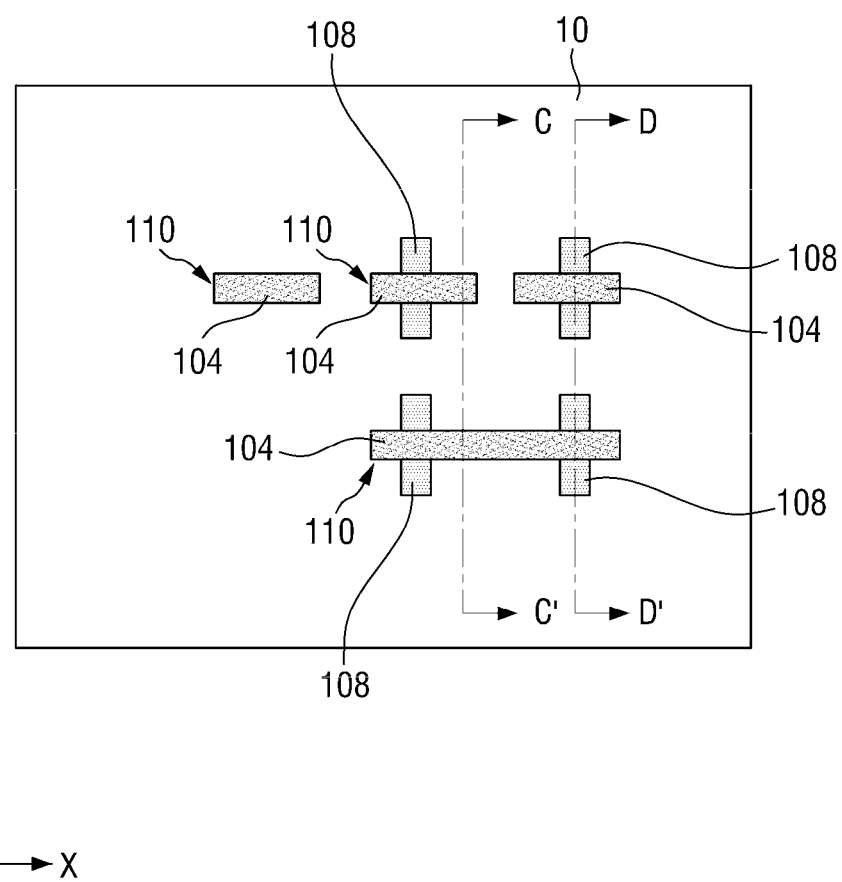
Figure 19B:
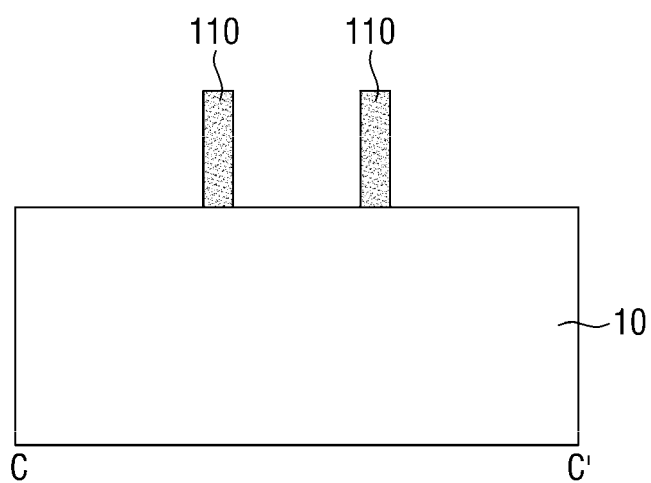
Figure 20A:
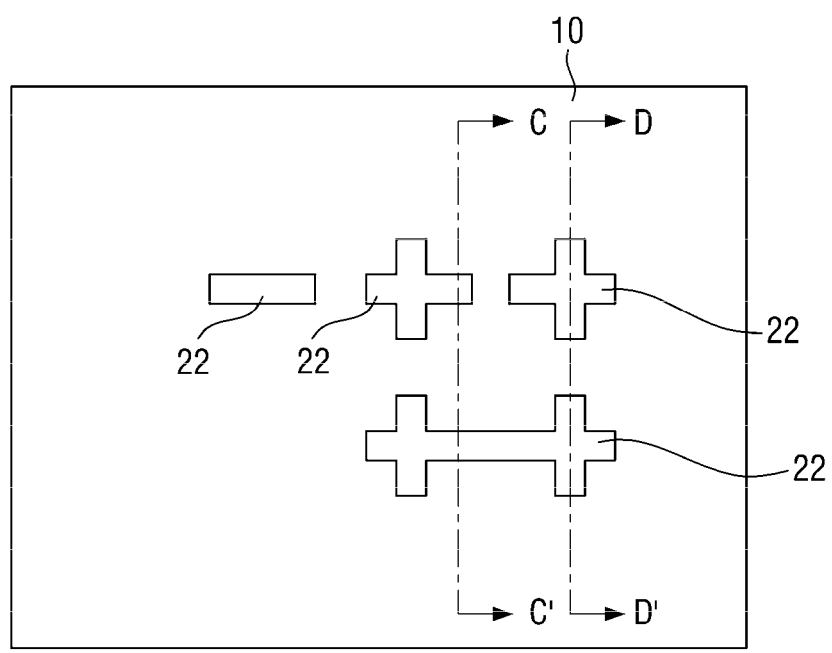

Referring to FIGS. 10, 17A, 17B, and 17C, the methods may removing the second preliminary mask layer 204 (Block 1070). In some embodiments, the first mask layer 104 may include first portions (e.g., 104a and 104b), and the second mask layer 108 may include second portions (e.g., 108a, 108b, and 108c). Each of the first portions 104a and 104b of the first mask layer 104 may extend longitudinally in the first horizontal direction X, and the first portions 104a and 104b of the first mask layer 104 may be spaced apart from each other in the second horizontal direction Y, as illustrated in FIG. 17A. The second portions 108a, 108b, and 108c of the second mask layer 108 may be spaced apart from each other in the second horizontal direction Y, and each of the second portions 108a, 108b, and 108c of the second mask layer 108 may connect the adjacent first portions 104a and 104b, as illustrated in FIGS. 17A and 17C.

Referring to FIGS. 10, 18A, 18B, and 18C, the methods may include forming a third mask layer 302 (Block 1080) on the first mask layer 104 and the second mask layer 108.

Referring to FIGS. 10, 19A, 19B, and 19C, the methods may include forming an etch mask layer 110 (Block 1090) by removing portions of the first mask layer 104 and the second mask layer 108. Each of the etch mask layers 110 may include a portion of the first mask layer 104 and/or a portion of the second mask layer 108.

Referring to FIGS. 9, 20A, 20B, and 20C, the methods may include forming the channel regions 22 by etching the substrate 10 using the etch mask layer 110.

Although the substrate 10 is illustrated as a single layer in FIGS. 11A through 20C, it will be understood that the substrate 10 can include multiple layers. For example, the substrate 10 may include a stacked structure including a first semiconductor layer, an insulating layer, and a second semiconductor layer that are sequentially stacked in a vertical direction (e.g., the vertical direction Z), and two channel regions (e.g., the channel region 22 and the upper channel region 62 of the stacked VFET in FIGS. 7 and 8) may be formed by etching the stacked structure of the substrate 10 using the etch mask layer 110.

Figure 21:
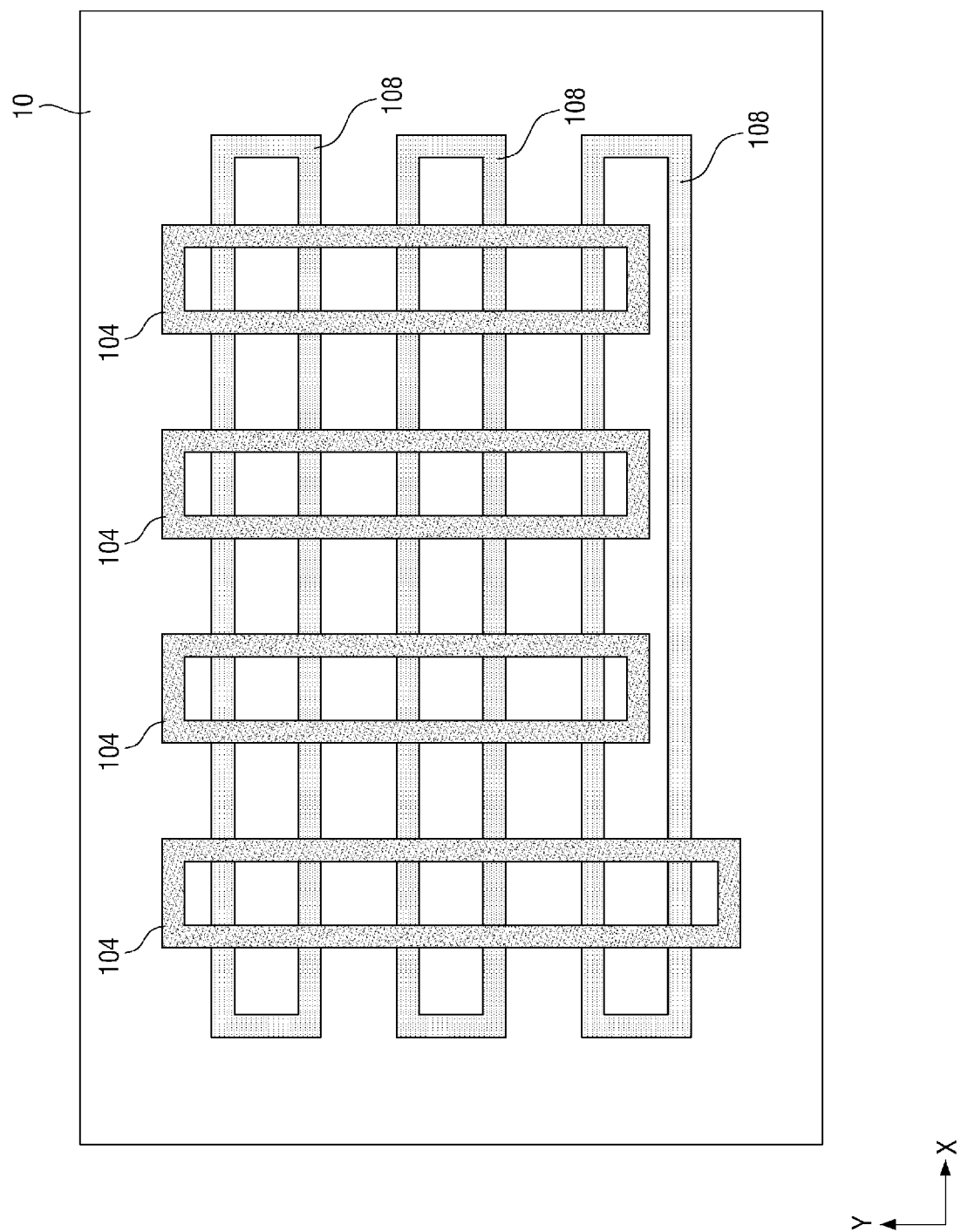
FIGS. 21 to 23 are plan views illustrating methods of forming etch mask layers having various shapes according to some embodiments of the present inventive concept.
Figure 22:
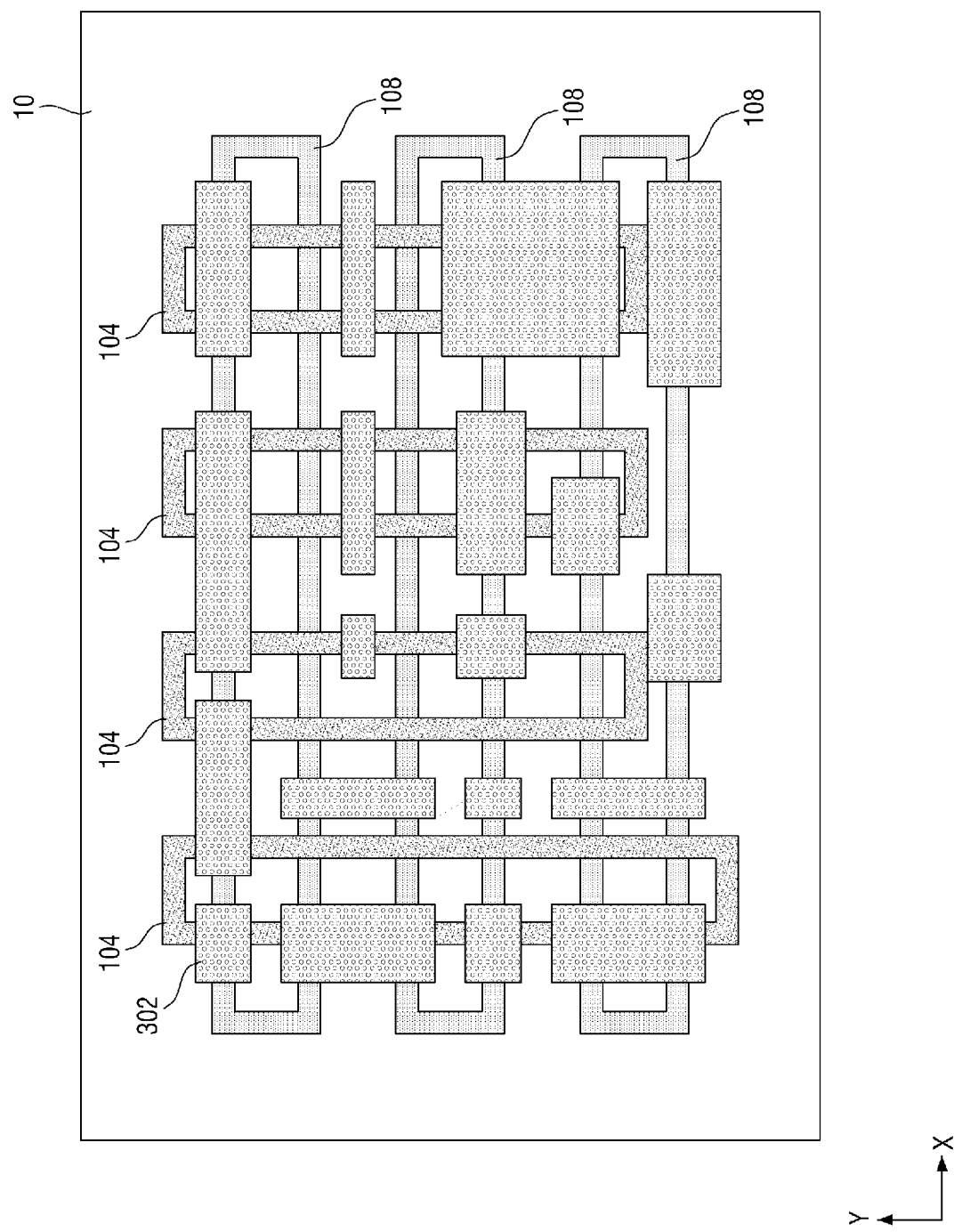
Figure 23:
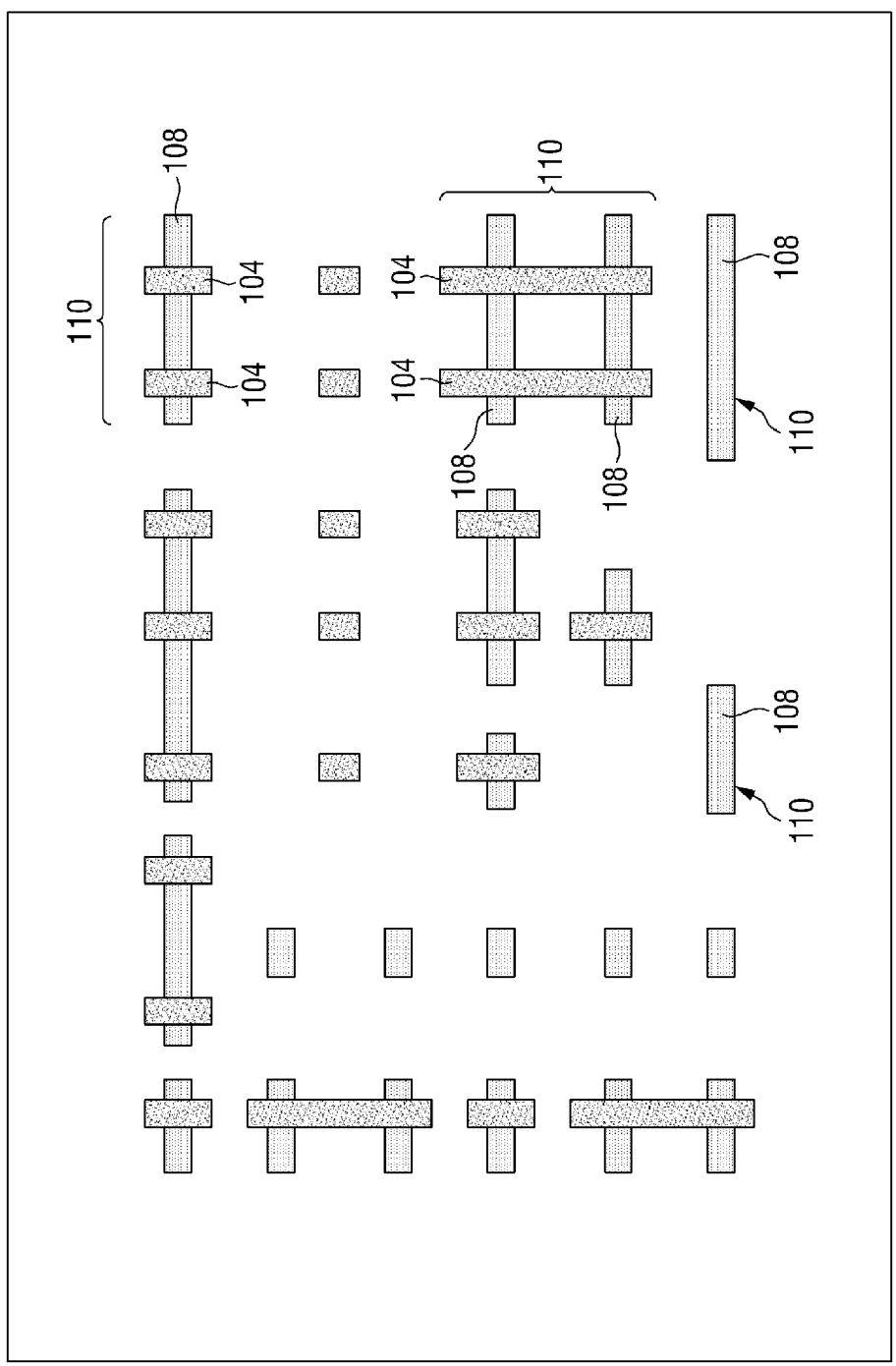

FIGS. 21 to 23 are plan views illustrating methods of forming etch mask layers 110 having various shapes according to some embodiments of the present inventive concept. FIG. 21 shows first mask layers 104 and second mask layers 108 formed on a substrate 10 in a plan view. The first mask layers 104 and the second mask layers 108 may be formed by the methods described with reference to FIG. 10 and FIG. 11A through 17C.

Referring to FIG. 22, third mask layers 302 may be formed on the first mask layers 104 and the second mask layers 108. Referring to FIG. 23, etch mask layers 110 may be formed on the substrate 10 by etching the first mask layers 104 and the second mask layers 108 using the third mask layers 302 as an etch mask. It will be understood that the etch mask layers 110 having various shapes may be formed by forming the third mask layers 302 having various shapes. Channel regions having various shapes may be formed by etching the substrate 10 using the etch mask layers 110 as an etch mask.

Example embodiments are described herein with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

It should be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the present inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
   a vertical field-effect transistor (VFET) comprising:
      a bottom source/drain region in a substrate;
      a channel region on the bottom source/drain region, wherein the channel region comprises a cross-shaped upper surface;
      a top source/drain region on the channel region;
      a gate structure on a side of the channel region;
      a first spacer vertically interposed between the bottom source/drain region and the gate structure; and
      a second spacer vertically interposed between the gate structure and the top source/drain region.

2. The integrated circuit device of claim 1, wherein the gate structure comprises a gate electrode, and the gate electrode encloses the channel region.

3. The integrated circuit device of claim 1, wherein an upper surface of the top source/drain region has a cross shape and vertically overlaps the cross-shaped upper surface of the channel region.

4. The integrated circuit device of claim 3, wherein the upper surface of the top source/drain region vertically overlaps an entirety of the cross-shaped upper surface of the channel region.

5. The integrated circuit device of claim 1, wherein the cross-shaped upper surface of the channel region comprises first and second cross-shaped portions.

6. The integrated circuit device of claim 1, wherein the VFET is a first VFET, and the integrated circuit device further comprises a second VFET, and
   wherein the second VFET comprises a second channel region that comprises a line-shaped upper surface.

7. The integrated circuit device of claim 1, wherein the VFET is a first VFET, and the integrated circuit device further comprises a second VFET that is on the top source/drain region of the first VFET and comprises a second channel region, and
   wherein the second channel region comprises a cross-shaped upper surface and vertically overlaps the cross-shaped upper surface of the channel region of the first VFET.

8. The integrated circuit device of claim 7, further comprising an insulating layer that is between the channel region of the first VFET and the second channel region of the second VFET and comprises a cross-shaped upper surface.

9. The integrated circuit device of claim 8, wherein the cross-shaped upper surface of the second channel region of the second VFET vertically overlaps the cross-shaped upper surface of the insulating layer and the cross-shaped upper surface of the channel region of the first VFET.

10. An integrated circuit device comprising:
    a vertical field-effect transistor (VFET) comprising:
       a bottom source/drain region in a substrate;
       a channel region on the substrate, wherein the channel region comprises a core portion, a first pair of protruding portions, and a second pair of protruding portions, wherein the first pair of protruding portions protrude toward respective opposite directions from the core portion along a first horizontal direction, and the second pair of protruding portions protrude toward respective opposite directions from the core portion along a second horizontal direction, and wherein the first horizontal direction and the second horizontal direction are parallel to an upper surface of the substrate and are different from each other;
a top source/drain region on the channel region, wherein the channel region is between the bottom source/drain region and the top source/drain region;
a gate structure on a side of the channel region;
a first spacer vertically interposed between the bottom source/drain region and the gate structure; and
a second spacer vertically interposed between the gate structure and the top source/drain region.

11. The integrated circuit device of claim 10, wherein the channel region further comprises a third pair of protruding portions that protrude toward respective opposite directions from a portion of one of the second pair of protruding portions along the first horizontal direction.

12. The integrated circuit device of claim 10, wherein the second pair of protruding portions have different lengths in the second horizontal direction.

13. The integrated circuit device of claim 10, wherein the VFET is a first VFET, and the integrated circuit device further comprises a second VFET, and
wherein the second VFET comprises a second channel region that comprises a line-shaped upper surface.

14. The integrated circuit device of claim 10, wherein the gate structure comprises a gate electrode, and the gate electrode encloses the channel region.

15. The integrated circuit device of claim 10, wherein the top source/drain region vertically overlaps an entirety of the core portion of the channel region and vertically overlaps the first pair of protruding portions and the second pair of protruding portions.

16. The integrated circuit device of claim 15, wherein the top source/drain region vertically overlaps entireties of the first pair of protruding portions and the second pair of protruding portions.

17. An integrated circuit device comprising:
a vertical field-effect transistor (VFET) comprising:
a bottom source/drain region in a substrate;
a channel region on the bottom source/drain region;
a top source/drain region on the channel region, wherein the top source/drain region comprises a cross-shaped upper surface, and the channel region is between the bottom source/drain region and the top source/drain region;
a gate structure on a side of the channel region;
a first spacer vertically interposed between the bottom source/drain region and the gate structure; and
a second spacer vertically interposed between the gate structure and the top source/drain region.

18. The integrated circuit device of claim 17, wherein the top source/drain region vertically overlaps an entirety of the channel region.

19. The integrated circuit device of claim 17, wherein the channel region comprises a cross-shaped upper surface, and
wherein the cross-shaped upper surface of the top source/drain region vertically overlaps the cross-shaped upper surface of the channel region.

20. The integrated circuit device of claim 1, wherein the top source/drain region includes a lower surface facing the channel region and an upper surface opposite the lower surface of the top source/drain region,
the gate structure includes a lower surface facing the substrate and an upper surface opposite the lower surface of the gate structure, and
the upper surface of the gate structure being closer to the substrate than the upper surface of the top source/drain region.

* * * * *